US011665974B2

(12) United States Patent
Rizzolo et al.

(10) Patent No.: US 11,665,974 B2
(45) Date of Patent: May 30, 2023

(54) MRAM CONTAINING MAGNETIC TOP CONTACT

(71) Applicant: INTERNATIONAL BUSINESS MACHINES CORPORATION, Armonk, NY (US)

(72) Inventors: Michael Rizzolo, Delmar, NY (US); Saba Zare, White Plains, NY (US); Virat Vasav Mehta, Albany, NY (US); Eric Raymond Evarts, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/248,479

(22) Filed: Jan. 27, 2021

(65) Prior Publication Data
US 2022/0238794 A1  Jul. 28, 2022

(51) Int. Cl.
*G11C 11/00* (2006.01)
*G11C 11/16* (2006.01)

(52) U.S. Cl.
CPC ........... *H10N 50/10* (2023.02); *G11C 11/161* (2013.01); *H10B 61/00* (2023.02); *H10N 50/01* (2023.02); *H10N 50/80* (2023.02); *H10N 50/85* (2023.02)

(58) Field of Classification Search
CPC ....... H01L 43/08; H01L 27/222; H01L 43/02; H01L 43/10; H01L 43/12; G11C 11/161
USPC ....................................................... 365/158
See application file for complete search history.

(56) References Cited

U.S. PATENT DOCUMENTS

| 735,351 | A | * | 8/1903 | Dreger et al. | ............ | F42B 5/26 |
| | | | | | | 102/464 |
| 6,707,083 | B1 | * | 3/2004 | Hiner | ...................... | G11C 11/16 |
| | | | | | | 257/295 |
| 6,803,615 | B1 | * | 10/2004 | Sin | .......................... | H01L 43/08 |
| | | | | | | 257/E27.005 |
| 7,033,881 | B2 | | 4/2006 | Gaidis | | |
| 7,442,647 | B1 | * | 10/2008 | Kanakasabapathy | ... | H01L 43/12 |
| | | | | | | 438/720 |

(Continued)

FOREIGN PATENT DOCUMENTS

| CN | 112018146 A | * | 12/2020 | ........... | G11C 11/161 |
| JP | 2006005342 A | | 1/2006 | | |
| WO | 2022161792 A1 | | 8/2022 | | |

OTHER PUBLICATIONS

Notification of Transmittal of the International Search Report and the Written Opinion of the International Searching Authority, or the Declaration, dated May 12, 2022, Applicant's or agent's file reference P201909442, International application No. PCT/EP2022/050731, 11 pages.

*Primary Examiner* — Viet Q Nguyen
(74) *Attorney, Agent, or Firm* — L. Jeffrey Kelly (57) ABSTRACT

An embodiment of the invention may include a magnetic random-access memory (MRAM) structure and method of making the structure. The MRAM structure may include a magnetic tunnel junction stack. The MRAM structure may include a magnetic liner located between the magnetic tunnel junction stack and a top contact, where the magnetic liner may be a ferromagnetic material. This may enable the magnetic liner to act as an independent variable to balance many of the magnetic parameters in the MTJ film stack in order to achieve zero magnetic field at the MTJ layer.

25 Claims, 6 Drawing Sheets

(56) References Cited

U.S. PATENT DOCUMENTS

| | | | |
|---|---|---|---|
| 7,782,660 B2* | 8/2010 | Assefa | H01L 27/228 |
| | | | 365/158 |
| 8,557,610 B2 | 10/2013 | Chen | |
| 9,059,400 B2* | 6/2015 | Beery | H01L 43/12 |
| 9,230,565 B1 | 1/2016 | Xiao | |
| 9,559,294 B2* | 1/2017 | Hsu | H01L 43/12 |
| 9,564,403 B2 | 2/2017 | Allinger | |
| 9,728,714 B2* | 8/2017 | Annunziata | H01L 43/02 |
| 10,096,768 B2 | 10/2018 | Jiang | |
| 10,608,046 B2* | 3/2020 | Yi | H01L 27/228 |
| 2007/0014146 A1* | 1/2007 | Guo | G11C 11/16 |
| | | | 365/158 |
| 2008/0198647 A1* | 8/2008 | Kanakasabapathy | |
| | | | H01L 27/222 |
| | | | 365/171 |
| 2009/0218644 A1* | 9/2009 | Lee | H01L 27/222 |
| | | | 257/E23.141 |
| 2009/0237982 A1* | 9/2009 | Assefa | G11C 11/1659 |
| | | | 365/158 |
| 2012/0205764 A1 | 8/2012 | Chen | |
| 2015/0270481 A1* | 9/2015 | Annunziata | H01L 43/12 |
| | | | 257/421 |
| 2016/0336506 A1 | 11/2016 | Annunziata | |
| 2017/0098759 A1* | 4/2017 | Oh | H01L 43/12 |
| 2019/0207083 A1 | 7/2019 | Zhong | |
| 2020/0180911 A1* | 6/2020 | Studer | B66B 11/0095 |
| 2020/0350246 A1* | 11/2020 | Lin | H01L 23/53209 |
| 2020/0373478 A1* | 11/2020 | Wang | G11C 5/06 |
| 2021/0359197 A1* | 11/2021 | Frougier | H01L 43/12 |
| 2022/0052255 A1* | 2/2022 | Yang | H01L 27/222 |
| 2022/0180911 A1* | 6/2022 | Zare | H01L 43/02 |
| 2022/0285606 A1* | 9/2022 | Li | H01L 43/02 |

* cited by examiner

MRAM CONTAINING MAGNETIC TOP CONTACT

BACKGROUND

The present invention relates to memory devices, and more specifically, to magnetic random-access memory (MRAM).

Unlike conventional random-access memory (RAM) chip technologies, magnetic RAM (MRAM) does not store data as electric charge, but instead stores data by magnetic polarization of storage elements. Typically, storage elements are formed from two ferromagnetic layers separated by a tunneling layer. One of the ferromagnetic layers has at least one pinned magnetic polarization (or fixed layer) set to a particular polarity. The magnetic polarity of the other ferromagnetic layer (or free layer) is altered to represent either a "1" (i.e., anti-parallel polarity to the fixed layer) or "0" (i.e., parallel polarity to the fixed layer). One device having a fixed layer, a tunneling layer, and a free layer is a magnetic tunnel junction (MTJ). The electrical resistance of a MTJ is dependent on the magnetic polarity of the free layer compared to the magnetic polarity of the fixed layer. A memory device such as MRAM can be built from an array of individually addressable MTJs.

BRIEF SUMMARY

An embodiment of the invention may include a magnetic random-access memory (MRAM) structure. The MRAM structure may include a magnetic tunnel junction stack. The MRAM structure may include a magnetic liner located between the magnetic tunnel junction stack and a top contact, where the magnetic liner may be a ferromagnetic material. This may enable the magnetic liner to act as an independent variable to balance many of the magnetic parameters in the MTJ film stack in order to achieve zero magnetic field at the MTJ layer.

In an embodiment of the MRAM structure, the ferromagnetic material may be cobalt. This may enable the magnetic liner to act as an independent variable to balance many of the magnetic parameters in the MTJ film stack in order to achieve zero magnetic field at the MTJ layer.

In an embodiment of the MRAM structure, the ferromagnetic material may be nickel, iron, rare-earth elements, or combinations thereof. This may enable the magnetic liner to act as an independent variable to balance many of the magnetic parameters in the MTJ film stack in order to achieve zero magnetic field at the MTJ layer.

In an embodiment of the MRAM structure a thickness of the ferromagnetic material may be about 1 to about 20 nm. This may enable the magnetic liner to act as an independent variable to balance many of the magnetic parameters in the MTJ film stack in order to achieve zero magnetic field at the MTJ layer.

In an embodiment of the MRAM structure there may be a diffusion liner between the top contact and the magnetic liner. This may improve long term device reliability and function of the magnetic liner.

In an embodiment of the MRAM structure there may be a metal located between the metal contact and the magnetic tunnel junction stack. This may improve long term device reliability and function of the magnetic liner.

An embodiment of the invention may include a magnetic random-access memory (MRAM) structure. The MRAM structure may include a magnetic tunnel junction stack. The MRAM structure may include a metal on the magnetic tunnel junction stack. The MRAM structure may include a magnetic liner located on a top surface of the metal, where the magnetic liner may be a ferromagnetic material. This may enable the magnetic liner to act as an independent variable to balance many of the magnetic parameters in the MTJ film stack in order to achieve zero magnetic field at the MTJ layer.

In an embodiment of the MRAM structure, the ferromagnetic material may be cobalt. This may enable the magnetic liner to act as an independent variable to balance many of the magnetic parameters in the MTJ film stack in order to achieve zero magnetic field at the MTJ layer.

In an embodiment of the MRAM structure, the ferromagnetic material may be nickel, iron, rare-earth elements, or combinations thereof. This may enable the magnetic liner to act as an independent variable to balance many of the magnetic parameters in the MTJ film stack in order to achieve zero magnetic field at the MTJ layer.

In an embodiment of the MRAM structure a thickness of the ferromagnetic material may be about 1 to about 20 nm. This may enable the magnetic liner to act as an independent variable to balance many of the magnetic parameters in the MTJ film stack in order to achieve zero magnetic field at the MTJ layer.

In an embodiment of the MRAM structure there may be a diffusion liner between a top contact and the magnetic liner. This may improve long term device reliability and function of the magnetic liner.

An embodiment of the invention may include a magnetic random-access memory (MRAM) structure. The MRAM structure may include a magnetic tunnel junction stack. The MRAM structure may include a metal on the magnetic tunnel junction stack. The MRAM structure may include a magnetic liner located on a side surface of the metal, where the magnetic liner may be a ferromagnetic material. This may enable the magnetic liner to act as an independent variable to balance many of the magnetic parameters in the MTJ film stack in order to achieve zero magnetic field at the MTJ layer.

In an embodiment of the MRAM structure, the ferromagnetic material may be cobalt. This may enable the magnetic liner to act as an independent variable to balance many of the magnetic parameters in the MTJ film stack in order to achieve zero magnetic field at the MTJ layer.

In an embodiment of the MRAM structure, the ferromagnetic material may be nickel, iron, rare-earth elements, or combinations thereof. This may enable the magnetic liner to act as an independent variable to balance many of the magnetic parameters in the MTJ film stack in order to achieve zero magnetic field at the MTJ layer.

In an embodiment of the MRAM structure a thickness of the ferromagnetic material may be about 1 to about 20 nm. This may enable the magnetic liner to act as an independent variable to balance many of the magnetic parameters in the MTJ film stack in order to achieve zero magnetic field at the MTJ layer.

In an embodiment of the MRAM structure there may be a diffusion liner between a top contact and the magnetic liner. This may improve long term device reliability and function of the magnetic liner.

An embodiment of the invention may include a magnetic random-access memory (MRAM) structure. The MRAM structure may include a magnetic tunnel junction stack. The MRAM structure may include a metal on the magnetic tunnel junction stack. The MRAM structure may include a magnetic liner located on a top surface and a side surface of the metal, where the magnetic liner may be a ferromagnetic material. This may enable the magnetic liner to act as an independent variable to balance many of the magnetic parameters in the MTJ film stack in order to achieve zero magnetic field at the MTJ layer.

In an embodiment of the MRAM structure, the ferromagnetic material may be cobalt. This may enable the magnetic liner to act as an independent variable to balance many of the magnetic parameters in the MTJ film stack in order to achieve zero magnetic field at the MTJ layer.

In an embodiment of the MRAM structure, the ferromagnetic material may be nickel, iron, rare-earth elements, or combinations thereof. This may enable the magnetic liner to act as an independent variable to balance many of the magnetic parameters in the MTJ film stack in order to achieve zero magnetic field at the MTJ layer.

In an embodiment of the MRAM structure a thickness of the ferromagnetic material may be about 1 to about 20 nm. This may enable the magnetic liner to act as an independent variable to balance many of the magnetic parameters in the MTJ film stack in order to achieve zero magnetic field at the MTJ layer.

In an embodiment of the MRAM structure there may be a diffusion liner between a top contact and the magnetic liner. This may improve long term device reliability and function of the magnetic liner.

An embodiment of the invention may include a method of forming a magnetic random-access memory (MRAM) structure. The method may include forming a metal liner above a magnetic tunnel junction stack. The method may include forming a top contact above the metal liner. This may enable the formation of a structure where the magnetic liner to act as an independent variable to balance many of the magnetic parameters in the MTJ film stack in order to achieve zero magnetic field at the MTJ layer.

In an embodiment of the method the ferromagnetic material may be cobalt. This may enable the formation of a structure where the magnetic liner to act as an independent variable to balance many of the magnetic parameters in the MTJ film stack in order to achieve zero magnetic field at the MTJ layer.

In an embodiment of the method a thickness of the ferromagnetic material may be about 1 to about 20 nm. This may enable the formation of a structure where the magnetic liner to act as an independent variable to balance many of the magnetic parameters in the MTJ film stack in order to achieve zero magnetic field at the MTJ layer.

In an embodiment of the method, forming the magnetic liner above the magnetic tunnel junction stack may include selectively forming the magnetic liner on a metal hardmask located above the magnetic tunnel junction stack. This may enable the formation of a structure where the magnetic liner to act as an independent variable to balance many of the magnetic parameters in the MTJ film stack in order to achieve zero magnetic field at the MTJ layer.

In an embodiment of the method, a portion of the magnetic liner located on a top surface of the metal hardmask may be removed. This may enable the formation of a structure where the magnetic liner to act as an independent variable to balance many of the magnetic parameters in the MTJ film stack in order to achieve zero magnetic field at the MTJ layer.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

In Magnetic Tunnel Junctions (MTJs) the current induced magnetization is the main phenomenon of interest for MRAM devices. So, the average external magnetic field on Free Layer (FL) needs to be zero. In order to do that the reference layer is separated with a thin Antiferromagnetic layer to have opposite magnetization and the zero magnetic field is achieved by balancing these two layers. The balancing between the two layers can be very challenging and is being carried out by controlling down to a few angstroms of thickness in each of those layers. Further, some integration process flows, such as IBE can simply modify the size of reference layers and change the balance even after the blanket film deposition by non-uniformly etching the top and bottom reference layer in their sidewalls.

By adding a selective metal liner to a contact of the MTJ stack, we can create an additional tunable parameter to balance the magnetic field on the free layer.

Figure 1:
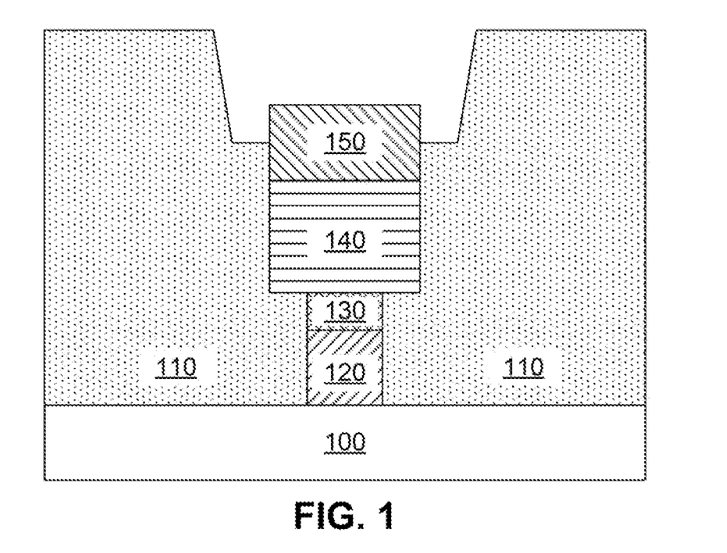
FIG. 1 depicts an MRAM cell, according to an exemplary embodiment.

FIG. 1 depicts a starting magnetic random access memory (MRAM). The MRAM device is located on an Mx layer 100 of a semiconductor device. The MRAM device may include a bottom contact 120, a diffusion barrier 130, a magnetic tunnel junction (MTJ) stacks 140, and a metal hardmask 150. The MRAM device may be isolated from surrounding devices by an ILD 110.

The Mx layer 100 may include underlying wiring, memory, or logic devices. Such underlying structure use the state contained in the MRAM in calculations or functioning of the semiconductor device that the MRAM is a part of.

The ILD 110 may be selected from the group consisting of silicon containing materials such as SiO2, Si3N4, SiOxNy, SiC, SiCO, SiCOH, and SiCH compounds, the above-mentioned silicon containing materials with some or all of the Si replaced by carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the ILD 110 include any of the aforementioned materials in porous form, or in a form that changes during processing to or from being porous and/or permeable to being non-porous and/or non-permeable. In the current embodiment, the trench in the ILD 110 goes beneath the top of the metal hardmask 150, which enables a metal liner 160 to be formed down the sides of the metal hardmask 150. The distance of the trench down the height of the metal hardmask 150 may be 5-50% of the height of the metal hardmask 150.

Bottom contact 120 may include a connection to other devices located throughout a semiconductor device. Bottom contact 120 may include materials such as, for example, copper, aluminum, titanium nitride, tantalum nitride or tungsten.

Diffusion barrier 130 may be any conductive material that blocks migration of atoms or ions out of the MTJ stack 140 into the bottom contact 120 or vice versa. For example, the diffusion barrier 130 may be formed of a metal such as tantalum, titanium, tungsten, tungsten nitride, nickel, platinum, ruthenium, or the like.

The MTJ stack 140 includes two layers of ferromagnetic material separated by a thin insulating tunnel barrier layer. The insulating tunnel barrier layer is sufficiently thin that quantum-mechanical tunneling of the charge carriers occurs between the ferromagnetic electrodes. The tunneling process is electron spin dependent, which means that the tunneling current across the junction depends on the spin-dependent electronic properties of the ferromagnetic materials and is a function of the relative orientation of the magnetic moments (magnetization directions) of the two ferromagnetic layers. The two ferromagnetic layers are designed to have different responses to magnetic fields so that the relative orientation of their moments can be varied with an external magnetic field. The MTJ is usable as, e.g., a memory cell in a nonvolatile magnetic random access memory (MRAM) array, and as, e.g., a magnetic field sensor, such as a magnetoresistive read head in a magnetic recording disk drive. The ferromagnetic layer material can be any suitable material, combination of materials, or alloy that exhibits magnetic properties, such as a ferromagnetic material or a ferromagnetic thin film including CoFe, CoFeB, NiFe, etc. The insulating layer may be any suitable material, or combination of materials that may be insulating and allow tunneling across the insulating layer, such as MRAM is a type of solid state memory that uses tunneling magnetoresistance (TMR) to store information. MRAM is made up of an electrically connected array of magnetoresistive memory elements, referred to as magnetic tunnel junctions (MTJs). Each MTJ includes a free layer having a magnetization direction that is variable, and a fixed layer having a magnetization direction that is invariable. The free layer and fixed layer each include a layer of a magnetic material and are separated by an insulating non-magnetic tunnel barrier. An MTJ stores information by switching the magnetization state of the free layer. When the magnetization direction of the free layer is parallel to the magnetization direction of the fixed layer, the MTJ is in a low resistance state. When the magnetization direction of the free layer is antiparallel to the magnetization direction of the fixed layer, the MTJ is in a high resistance state. The difference in resistance of the MTJ can be used to indicate a logical '1' or '0', thereby storing a bit of information. The TMR of an MTJ determines the difference in resistance between the high and low resistance states. A relatively high difference between the high and low resistance states facilitates read operations in the MRAM.

The metal hardmask 150 may be a metal layer used to define the footprint of the MTJ stack 140 during formation. The metal hardmask 150 can be tantalum nitride, titanium nitride, tungsten nitride, ruthenium/ruthenium nitride, cobalt nitride, platinum-group metal nitrides, their pure-metal counterparts, or the like.

Figure 2:
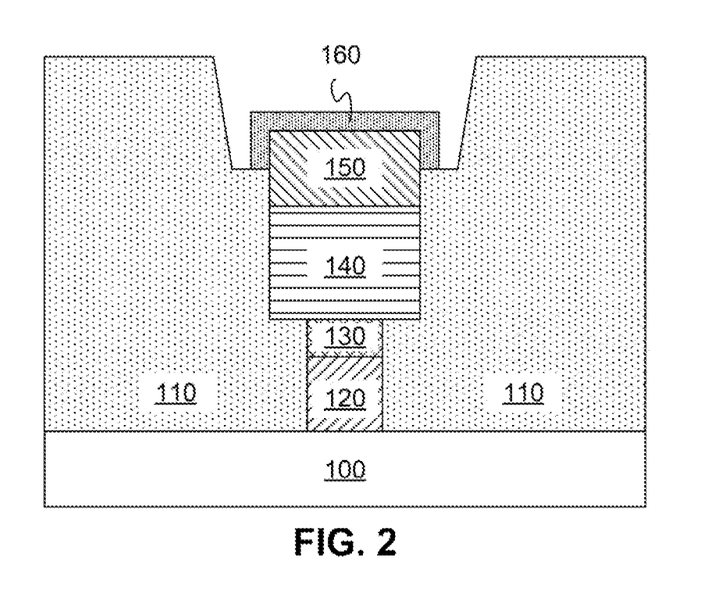
FIG. 2 depicts an MRAM cell following deposition of an inverted cup-shaped magnetic liner on a metal hardmask, according to an exemplary embodiment.

Referring to FIG. 2, a magnetic liner 160 is selectively deposited on the surfaces of the metal hardmask 150. Deposition of the magnetic liner 160 may be performed by atomic layer deposition (ALD), chemical vapor deposition (CVD), or any other suitable techniques that may selectively deposit the magnetic liner 160 on metal hardmask 150 without depositing the magnetic liner on the ILD 110. The magnetic liner 160 may be a ferromagnetic liner capable of exerting a magnetic field on MTJ stack 140. The magnetic liner 160 may be made of materials such as, for example, cobalt, nickel, iron, rare-earth elements, or a combination thereof. The magnetic liner may have a thickness of approximately 1 to 20 nm and may extend 5-50% of the height of the metal hardmask 150.

Figure 3:
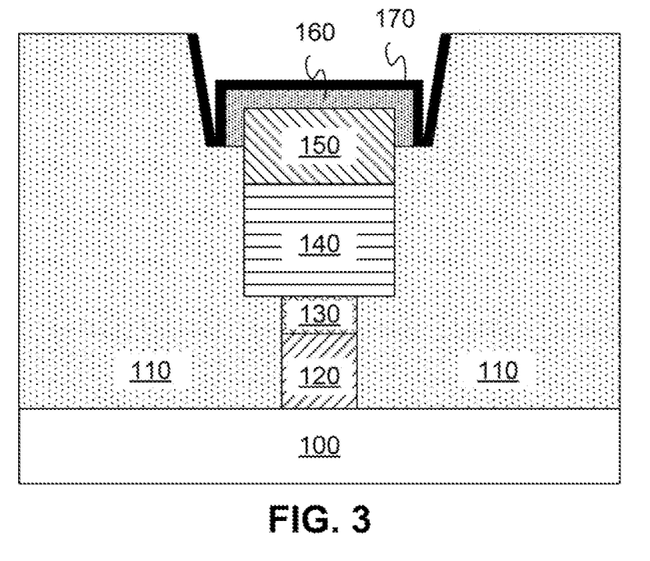
FIG. 3 depicts an MRAM cell following deposition of a liner, according to an exemplary embodiment.

Referring to FIG. 3, a liner 170 may be deposited on the magnetic liner, and along the sidewalls of the trench. Similar to the diffusion barrier 130, the liner 170 may include materials capable of blocking migration of atoms or ions out of or into the magnetic liner 160. The liner may be made of, for example, tantalum or tantalum nitride, and may include one or more layers of liner material. The liner 170 may be formed using a filling deposition technique such as electroplating, electroless plating, chemical vapor deposition, physical vapor deposition or a combination of methods.

Figure 4:
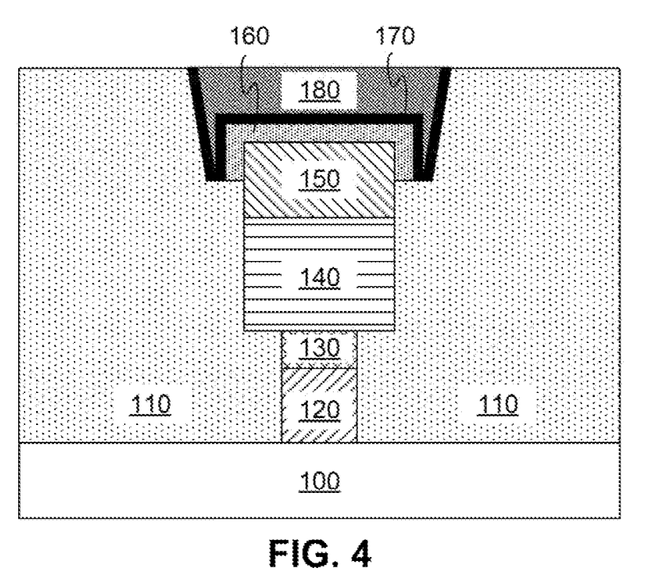
FIG. 4 depicts an MRAM cell following formation of a top contact, according to an exemplary embodiment.

Referring to FIG. 4, the trench may be filled with a top contact 180. Top contact 180 may be selected as a low resistance metal such as, for example, Al, W, Cu, TiN, TaN, or other suitable materials. The top contact 180 may be formed using a filling technique such as electroplating, electroless plating, chemical vapor deposition, physical vapor deposition or a combination of methods. The top contact 180 may be formed as part of a trench or via and may be connected to additional wiring on higher levels of the semiconductor chip.

Following the steps outlined in FIGS. 1-4, an MRAM cell exists having a magnetic liner 160 separated from an MTJ stack 140 by a metal hardmask 150. The MTJ stack 140 may be separated from a bottom contact 120 by a diffusion barrier 130. The magnetic liner 160 may be separated from the top contact 180 by a liner 170. The magnetic liner 160 may be located on all portions of the metal hardmask 160 that extends past ILD 110. This may enable the magnetic liner 160 to balance the magnetic field on the free layer of the MTJ stack 140 in order to achieve a 0 magnetic field at that layer. This may enable the magnetic liner to act as an independent variable to balance many of the magnetic parameters in the MTJ film stack.

Figure 5:
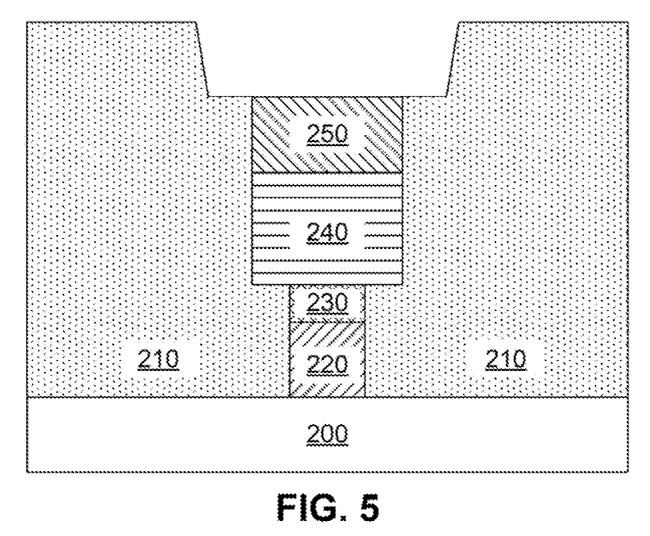
FIG. 5 depicts an MRAM cell, according to an exemplary embodiment.

FIG. 5 depicts a starting magnetic random access memory (MRAM). The MRAM device is located on an Mx layer 200 of a semiconductor device. The MRAM device may include a bottom contact 220, a diffusion barrier 230, a magnetic tunnel junction (MTJ) stacks 240, and a metal hardmask 250. The MRAM device may be isolated from surrounding devices by an ILD 210.

The Mx layer 200 may include underlying wiring, memory, or logic devices. Such underlying structure use the state contained in the MRAM in calculations or functioning of the semiconductor device that the MRAM is a part of.

The ILD 210 may be selected from the group consisting of silicon containing materials such as SiO2, Si3N4, SiOxNy, SiC, SiCO, SiCOH, and SiCH compounds, the above-mentioned silicon containing materials with some or all of the Si replaced by carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, a-C:H). Additional choices for the ILD 210 include any of the aforementioned materials in porous form, or in a form that changes during processing to or from being porous and/or permeable to being non-porous and/or non-permeable. The bottom of the trench formed in the ILD 110 is substantially coplanar to the top surface of the metal hardmask 250.

Bottom contact 220 may include a connection to other devices located throughout a semiconductor device. Bottom contact 220 may include materials such as, for example, copper, aluminum, titanium nitride, tantalum nitride or tungsten.

Diffusion barrier 230 may be any conductive material that blocks migration of atoms or ions out of the MTJ stack 240 into the bottom contact 220 or vice versa. For example, the diffusion barrier 230 may be formed of a metal such as tantalum, titanium, tungsten, tungsten nitride, nickel, platinum, ruthenium, or the like.

The MTJ stack 240 includes two layers of ferromagnetic material separated by a thin insulating tunnel barrier layer. The insulating tunnel barrier layer is sufficiently thin that quantum-mechanical tunneling of the charge carriers occurs between the ferromagnetic electrodes. The tunneling process is electron spin dependent, which means that the tunneling current across the junction depends on the spin-dependent electronic properties of the ferromagnetic materials and is a function of the relative orientation of the magnetic moments (magnetization directions) of the two ferromagnetic layers. The two ferromagnetic layers are designed to have different responses to magnetic fields so that the relative orientation of their moments can be varied with an external magnetic field. The MTJ is usable as, e.g., a memory cell in a nonvolatile magnetic random access memory (MRAM) array, and as, e.g., a magnetic field sensor, such as a magnetoresistive read head in a magnetic recording disk drive. The ferromagnetic layer material can be any suitable material, combination of materials, or alloy that exhibits magnetic properties, such as a ferromagnetic material or a ferromagnetic thin film including CoFe, CoFeB, NiFe, etc. The insulating layer may be any suitable material, or combination of materials that may be insulating and allow tunneling across the insulating layer, such as MRAM is a type of solid state memory that uses tunneling magnetoresistance (TMR) to store information. MRAM is made up of an electrically connected array of magnetoresistive memory elements, referred to as magnetic tunnel junctions (MTJs). Each MTJ includes a free layer having a magnetization direction that is variable, and a fixed layer having a magnetization direction that is invariable. The free layer and fixed layer each include a layer of a magnetic material and are separated by an insulating non-magnetic tunnel barrier. An MTJ stores information by switching the magnetization state of the free layer. When the magnetization direction of the free layer is parallel to the magnetization direction of the fixed layer, the MTJ is in a low resistance state. When the magnetization direction of the free layer is antiparallel to the magnetization direction of the fixed layer, the MTJ is in a high resistance state. The difference in resistance of the MTJ can be used to indicate a logical '1' or '0', thereby storing a bit of information. The TMR of an MTJ determines the difference in resistance between the high and low resistance states. A relatively high difference between the high and low resistance states facilitates read operations in the MRAM.

The metal hardmask 250 may be a metal layer used to define the footprint of the MTJ stack 240 during formation. The metal hardmask 250 can be tantalum nitride, titanium nitride, tungsten nitride, ruthenium/ruthenium nitride, cobalt nitride, platinum-group metal nitrides, their pure-metal counterparts, or the like.

Figure 6:
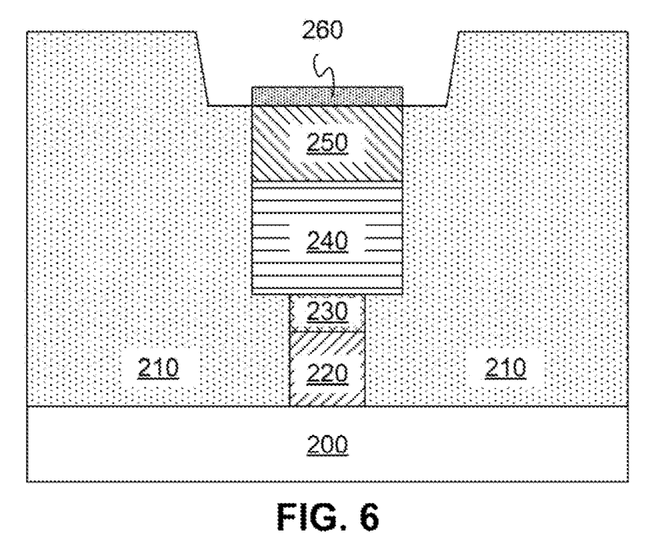
FIG. 6 depicts an MRAM cell following deposition of a magnetic liner on a metal hardmask, according to an exemplary embodiment.

Referring to FIG. 6, a magnetic liner 260 is selectively deposited on the surfaces of the metal hardmask 250. Deposition of the magnetic liner 260 may be performed by atomic layer deposition (ALD), chemical vapor deposition (CVD), or any other suitable techniques that may selectively deposit the magnetic liner 260 on metal hardmask 250 without depositing the magnetic liner on the ILD 210. The magnetic liner 260 may be a ferromagnetic liner capable of exerting a magnetic field on MTJ stack 240. The magnetic liner 260 may be made of materials such as, for example, cobalt, nickel, iron, rare-earth elements, or a combination thereof. The magnetic liner may have a thickness of approximately 2 to 20 nm and may extend 5-50% of the height of the metal hardmask 250.

Figure 7:
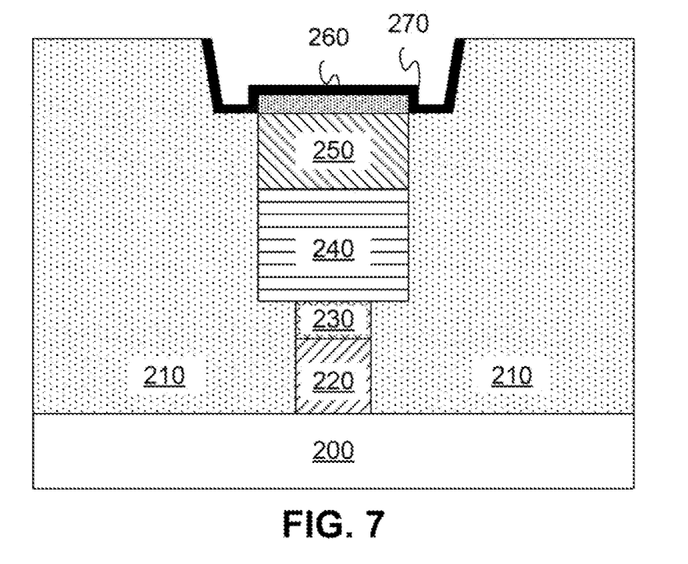
FIG. 7 depicts an MRAM cell following deposition of a primarily flat liner, according to an exemplary embodiment.

Referring to FIG. 7, a liner 270 may be deposited on the magnetic liner, and along the sidewalls of the trench. Similar to the diffusion barrier 230, the liner 270 may include materials capable of blocking migration of atoms or ions out the magnetic liner 260. The liner may be made of, for example, tantalum or tantalum nitride, and may include one or more layers of liner material. The liner 270 may be formed using a filling technique such as electroplating, electroless plating, chemical vapor deposition, physical vapor deposition or a combination of methods.

Figure 8:
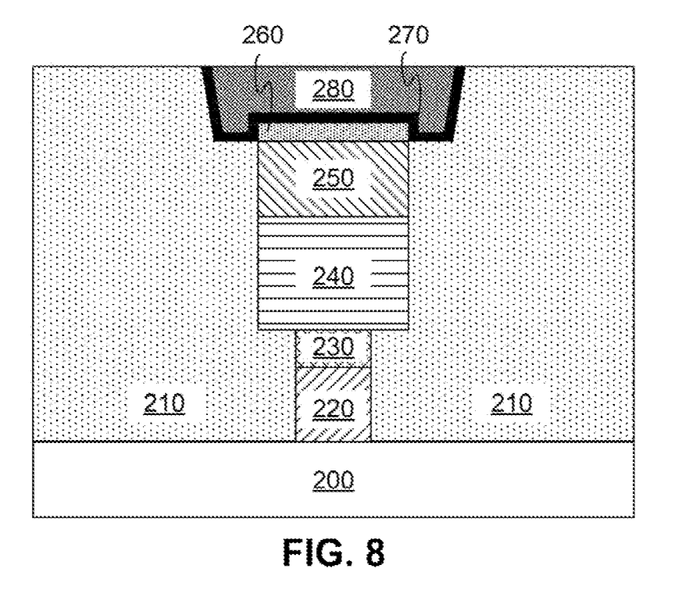
FIG. 8 depicts an MRAM cell following formation of a top contact, according to an exemplary embodiment.

Referring to FIG. 8, the trench may be filled with a top contact 280. Top contact 280 may be selected as a low resistance metal such as, for example, Al, W, Cu, TiN, TaN, or other suitable materials. The top contact 280 may be formed using a filling technique such as electroplating, electroless plating, chemical vapor deposition, physical vapor deposition or a combination of methods. The top contact 280 may be formed as part of a trench or via and may be connected to additional wiring on higher levels of the semiconductor chip.

Following the steps outlined in FIGS. 5-8, an MRAM cell exists having a magnetic liner 260 separated from an MTJ stack 240 by a metal hardmask 250. The MTJ stack 240 may be separated from a bottom contact 220 by a diffusion barrier 230. The magnetic liner 260 may be separated from the top contact 280 by a liner 270. The magnetic liner 260 may be located on the top surface of the metal hardmask 260. This may enable the magnetic liner 260 to balance the magnetic field on the free layer of the MTJ stack 240 in order to achieve a 0 magnetic field at that layer. This may enable the magnetic liner to act as an independent variable to balance many of the magnetic parameters in the MTJ film stack.

Figure 9:
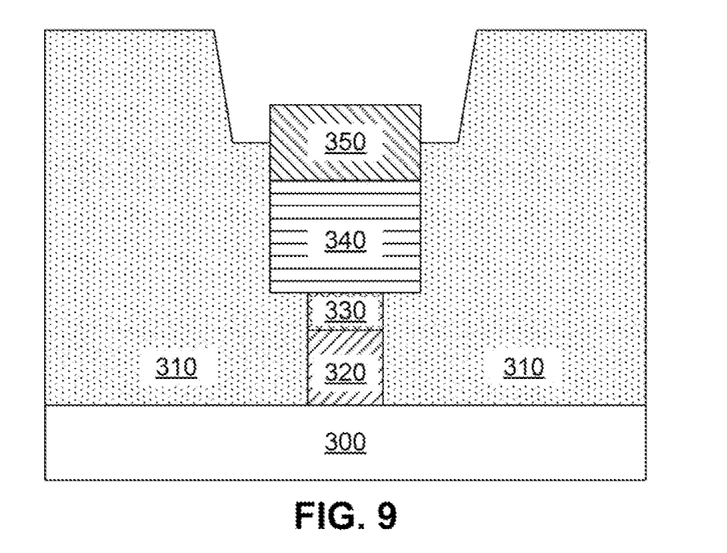
FIG. 9 depicts an MRAM cell, according to an exemplary embodiment.

FIG. 9 depicts a starting magnetic random access memory (MRAM). The MRAM device is located on an Mx layer 300 of a semiconductor device. The MRAM device may include a bottom contact 320, a diffusion barrier 330, a magnetic tunnel junction (MTJ) stacks 340, and a metal hardmask 350. The MRAM device may be isolated from surrounding devices by an ILD 310.

The Mx layer 300 may include underlying wiring, memory, or logic devices. Such underlying structure use the state contained in the MRAM in calculations or functioning of the semiconductor device that the MRAM is a part of.

The ILD 310 may be selected from the group consisting of silicon containing materials such as SiO2, Si3N4, SiOxNy, SiC, SiCO, SiCOH, and SiCH compounds, the above-mentioned silicon containing materials with some or all of the Si replaced by carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, a-C:H). Additional choices for the ILD 310 include any of the aforementioned materials in porous form, or in a form that changes during processing to or from being porous and/or permeable to being non-porous and/or non-permeable. In the current embodiment, the trench in the ILD 110 goes beneath the top of the metal hardmask 150, which enables a metal liner 160 to be formed down the sides of the metal hardmask 150. The distance of the trench down the height of the metal hardmask 150 may be 5-50% of the height of the metal hardmask 150

Bottom contact 320 may include a connection to other devices located throughout a semiconductor device. Bottom contact 320 may include materials such as, for example, copper, aluminum, titanium nitride, tantalum nitride or tungsten.

Diffusion barrier 330 may be any conductive material that blocks migration of atoms or ions out of the MTJ stack 340 into the bottom contact 320 or vice versa. For example, the diffusion barrier 330 may be formed of a metal such as tantalum, titanium, tungsten, tungsten nitride, nickel, platinum, ruthenium, or the like.

The MTJ stack 340 includes two layers of ferromagnetic material separated by a thin insulating tunnel barrier layer. The insulating tunnel barrier layer is sufficiently thin that quantum-mechanical tunneling of the charge carriers occurs between the ferromagnetic electrodes. The tunneling process is electron spin dependent, which means that the tunneling current across the junction depends on the spin-dependent electronic properties of the ferromagnetic materials and is a function of the relative orientation of the magnetic moments (magnetization directions) of the two ferromagnetic layers. The two ferromagnetic layers are designed to have different responses to magnetic fields so that the relative orientation of their moments can be varied with an external magnetic field. The MTJ is usable as, e.g., a memory cell in a nonvolatile magnetic random access memory (MRAM) array, and as, e.g., a magnetic field sensor, such as a magnetoresistive read head in a magnetic recording disk drive. The ferromagnetic layer material can be any suitable material, combination of materials, or alloy that exhibits magnetic properties, such as a ferromagnetic material or a ferromagnetic thin film including CoFe, CoFeB, NiFe, etc. The insulating layer may be any suitable material, or combination of materials that may be insulating and allow tunneling across the insulating layer, such as MRAM is a type of solid state memory that uses tunneling magnetoresistance (TMR) to store information. MRAM is made up of an electrically connected array of magnetoresistive memory elements, referred to as magnetic tunnel junctions (MTJs). Each MTJ includes a free layer having a magnetization direction that is variable, and a fixed layer having a magnetization direction that is invariable. The free layer and fixed layer each include a layer of a magnetic material and are separated by an insulating non-magnetic tunnel barrier. An MTJ stores information by switching the magnetization state of the free layer. When the magnetization direction of the free layer is parallel to the magnetization direction of the fixed layer, the MTJ is in a low resistance state. When the magnetization direction of the free layer is antiparallel to the magnetization direction of the fixed layer, the MTJ is in a high resistance state. The difference in resistance of the MTJ can be used to indicate a logical '1' or '0', thereby storing a bit of information. The TMR of an MTJ determines the difference in resistance between the high and low resistance states. A relatively high difference between the high and low resistance states facilitates read operations in the MRAM.

The metal hardmask 350 may be a metal layer used to define the footprint of the MTJ stack 340 during formation. The metal hardmask 350 can be tantalum nitride, titanium nitride, tungsten nitride, ruthenium/ruthenium nitride, cobalt nitride, platinum-group metal nitrides, their pure-metal counterparts, or the like.

Figure 10:
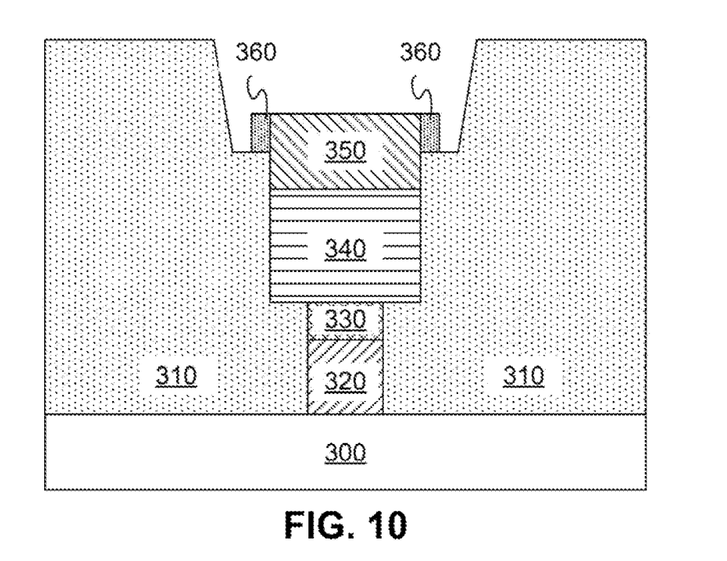
FIG. 10 depicts an MRAM cell following deposition of a ringed magnetic liner around a metal hardmask, according to an exemplary embodiment.

Referring to FIG. 10, a magnetic liner 360 is selectively deposited on the surfaces of the metal hardmask 350.

Deposition of the magnetic liner 360 may be performed by atomic layer deposition (ALD), chemical vapor deposition (CVD), or any other suitable techniques that may selectively deposit the magnetic liner 360 on metal hardmask 350 without depositing the magnetic liner on the ILD 310. The magnetic liner 360 may be a ferromagnetic liner capable of exerting a magnetic field on MTJ stack 340. The magnetic liner 360 may be made of materials such as, for example, Cobalt, nickel, iron, rare-earth elements, or a combination thereof. The magnetic liner may have a thickness of approximately 3 to 30 nm and may extend 5-50% of the height of the metal hardmask 350. Following selective deposition, an anisotropic etch, such as RIE, may be performed to remove the magnetic material from the top surface of the metal hardmask 250.

Figure 11:
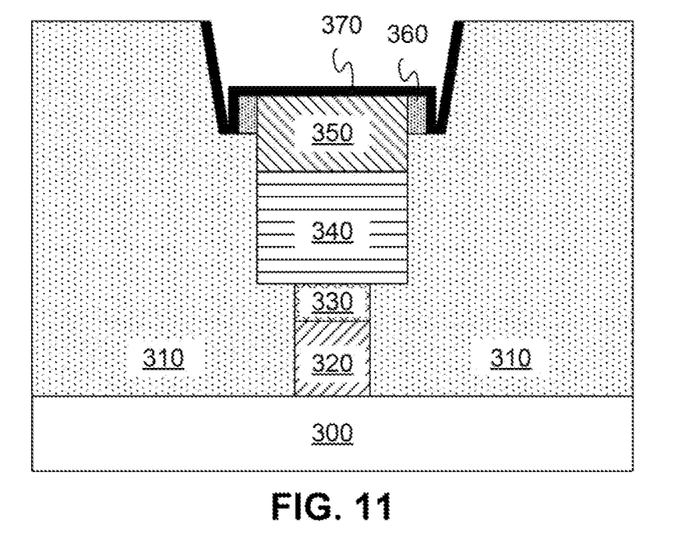
FIG. 11 depicts an MRAM cell following deposition of a liner, according to an exemplary embodiment.

Referring to FIG. 11, a liner 370 may be deposited on the magnetic liner, and along the sidewalls of the trench. Similar to the diffusion barrier 330, the liner 370 may include materials capable of blocking migration of atoms or ions out the magnetic liner 360. The liner may be made of, for example, tantalum or tantalum nitride, and may include one or more layers of liner material. The liner 370 may be formed using a filling technique such as electroplating, electroless plating, chemical vapor deposition, physical vapor deposition or a combination of methods.

Figure 12:
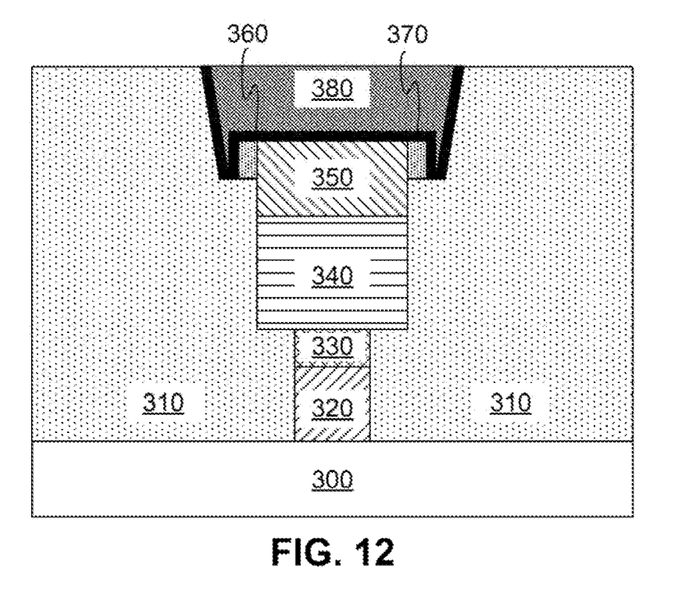
FIG. 12 depicts an MRAM cell following formation of a top contact, according to an exemplary embodiment.

Referring to FIG. 12, the trench may be filled with a top contact 380. Top contact 380 may be selected as a low resistance metal such as, for example, Al, W, Cu, TiN, TaN, or other suitable materials. The top contact 380 may be formed using a filling technique such as electroplating, electroless plating, chemical vapor deposition, physical vapor deposition or a combination of methods. The top contact 380 may be formed as part of a trench or via, and may be connected to additional wiring on higher levels of the semiconductor chip.

Following the steps outlined in FIGS. 9-12, an MRAM cell exists having a magnetic liner 360 separated from an MTJ stack 340 by a metal hardmask 350. The MTJ stack 340 may be separated from a bottom contact 320 by a diffusion barrier 330. The magnetic liner 360 may be separated from the top contact 380 by a liner 370. The magnetic liner 360 may be located on portions of the sidewall of the metal hardmask 360 that extends past ILD 310. This may enable the magnetic liner 360 to balance the magnetic field on the free layer of the MTJ stack 340 in order to achieve a 0 magnetic field at that layer. This may enable the magnetic liner to act as an independent variable to balance many of the magnetic parameters in the MTJ film stack.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A magnetic random-access memory (MRAM) structure comprising:
   a magnetic tunnel junction stack;
   a metal located on the magnetic tunnel junction stack, wherein a width of the metal is equal to a width of the magnetic tunnel junction stack; and
   a magnetic liner located between the metal and a top contact, wherein the magnetic liner comprises a ferromagnetic material, wherein at least a portion of the top contact is below a topmost surface of the metal.

2. The structure of claim 1, wherein the ferromagnetic material comprises cobalt.

3. The structure of claim 1, wherein the ferromagnetic material comprises at least one material selected from the group consisting of: nickel, iron, rare-earth elements.

4. The structure of claim 1, wherein a thickness of the ferromagnetic material is about 1 nm to about 20 nm.

5. The structure of claim 1 further comprising a diffusion liner between the top contact and the magnetic liner.

6. The structure of claim 1 wherein opposite vertical sidewalls of the magnetic tunnel junction stack are substantially flush with opposite vertical sidewalls of the metal.

7. A magnetic random-access memory (MRAM) structure comprising:
   a magnetic tunnel junction stack;
   a metal on the magnetic tunnel junction stack; and
   a magnetic liner located on a top surface of the metal, wherein the magnetic liner comprises a ferromagnetic material, wherein a width of the magnetic liner is equal to a width of the metal, wherein at least a portion of a top contact is below a topmost surface of the metal.

8. The structure of claim 7, wherein the ferromagnetic material comprises cobalt.

9. The structure of claim 7, wherein the ferromagnetic material comprises at least one material selected from the group consisting of: nickel, iron, rare-earth elements.

10. The structure of claim 7, wherein a thickness of the ferromagnetic material is about 1 nm to about 20 nm.

11. The structure of claim 7 further comprising a diffusion liner located between the magnetic liner and the top contact.

12. A magnetic random-access memory (MRAM) structure comprising:
    a magnetic tunnel junction stack;
    a metal on the magnetic tunnel junction stack; and
    a magnetic liner is located on a side surface of the metal, wherein the magnetic liner comprises a ferromagnetic material, wherein an uppermost surface of the magnetic liner is substantially flush with an uppermost surface of the metal.

13. The structure of claim 12, wherein the ferromagnetic material comprises cobalt.

14. The structure of claim 12, wherein the ferromagnetic material comprises at least one material selected from the group consisting of: nickel, iron, rare-earth elements.

15. The structure of claim 12, wherein a thickness of the ferromagnetic material is about 1 nm to about 20 nm.

16. The structure of claim 12 further comprising a diffusion liner located between the magnetic liner and a top contact, wherein the diffusion liner is in direct contact with the metal.

17. A magnetic random-access memory (MRAM) structure comprising:
    a magnetic tunnel junction stack;
    a metal on the magnetic tunnel junction stack, wherein a width of the metal is equal to a width of the magnetic tunnel junction stack; and
    a magnetic liner is located on a top surface and a side surface of the metal and between the metal and a top contact, wherein the magnetic liner comprises a magnetic material, wherein at least a portion of the top contact is below a topmost surface of the metal.

18. The structure of claim 17, wherein the magnetic liner comprises cobalt.

19. The structure of claim 17, wherein a thickness of the magnetic liner is about 1 nm to about 20 nm.

20. The structure of claim 17 further comprising a diffusion liner located between the magnetic liner and the top contact.

21. A method of forming a magnetic random-access memory (MRAM) structure comprising:
   forming a magnetic liner above a magnetic tunnel junction stack, wherein forming the magnetic liner above the magnetic tunnel junction stack comprises selectively forming the magnetic liner only on a metal hardmask located above the magnetic tunnel junction stack; and
   forming a top contact above the magnetic liner.

22. The method of claim 21, wherein the magnetic liner comprises cobalt.

23. The method of claim 21, further comprising removing a portion of the magnetic liner located on a top surface of the metal hardmask.

24. The method of claim 21, wherein a thickness of the magnetic liner is about 1 nm to about 20 nm.

25. The structure of claim 17 further comprising a diffusion liner located between the magnetic liner and a top contact, wherein a lower most surface of the diffusion liner is below an upper most surface of the metal.

\* \* \* \* \*